United States Patent
Oba

(10) Patent No.: US 6,488,769 B1
(45) Date of Patent: Dec. 3, 2002

(54) FLUORIDE REFINING METHOD AND FLUORIDE CRYSTAL MANUFACTURING METHOD, AND OPTICAL PART AND ALIGNER USING SAME

(75) Inventor: Tomoru Oba, Kashiwa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/422,110

(22) Filed: Oct. 20, 1999

(30) Foreign Application Priority Data

Oct. 21, 1998 (JP) .......................................... 10-299291
Oct. 18, 1999 (JP) .......................................... 11-296019

(51) Int. Cl.⁷ .......................... C30B 29/12; C30B 11/04
(52) U.S. Cl. .......................... 117/68; 117/77; 117/78; 117/81; 117/82; 117/940; 423/490
(58) Field of Search ............................... 117/68, 77, 78, 117/81, 82, 940; 423/490

(56) References Cited

U.S. PATENT DOCUMENTS

| | | | |
|---|---|---|---|
| 4,038,201 A | | 7/1977 | Hargreaves .................. 252/300 |
| 4,128,589 A | * | 12/1978 | Pastor et al. ................. 260/653 |
| 6,061,174 A | * | 5/2000 | Shiozawa et al. ............ 359/361 |
| 6,123,764 A | * | 9/2000 | Mizugaki et al. ............. 117/68 |

FOREIGN PATENT DOCUMENTS

EP 0869203 A2 10/1998

OTHER PUBLICATIONS

H. Guggenheim, "Growth of Highly Perfect Fluoride Single Crystals for Optical Masers", *J. Appl. Phys.*, 34, 2482–2485 (1963).
Mouchovski et al. "Growth of Ultra–violet Grade $CaF_2$ crystals and Their Application for Excimer Laser Optics", *Journal of Crystal Growth*, 162 (1996), pp. 79–82.
Patent abstracts of Japan, 09315893, vol. 1998, No. 4, Mar. 31, 1998.

* cited by examiner

*Primary Examiner*—Robert Kunemund
(74) *Attorney, Agent, or Firm*—Fitzpatrick, Cella, Harper & Scinto

(57) ABSTRACT

In order to provide a fluoride refining method and a fluoride crystal manufacturing method that have great general-purpose properties and can reduce the manufacturing cost and to provide at a low cost a fluoride crystal, an optical part and an aligner the transmission characteristics of which are hardly degraded even when repeatedly irradiated with a high-output light of a short wavelength for a long term, there is provided a method of refining a fluoride comprising the heating step of heating a solid scavenger-added fluoride raw material to melt the raw material and the cooling step of cooling the molten fluoride material to solidify the melt, wherein the environment of a chamber housing the fluoride raw material is changed to such an environment that a gas in the chamber is discharged to the outside of the chamber more easily than the environment before the change, during the heating step.

55 Claims, 12 Drawing Sheets

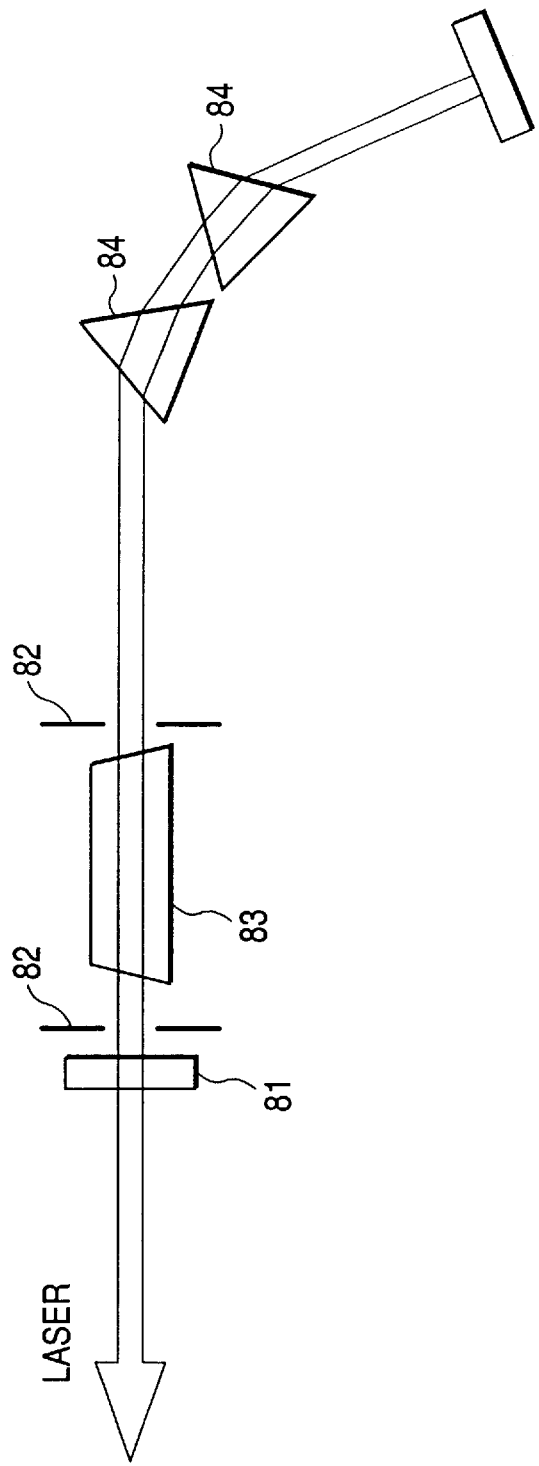
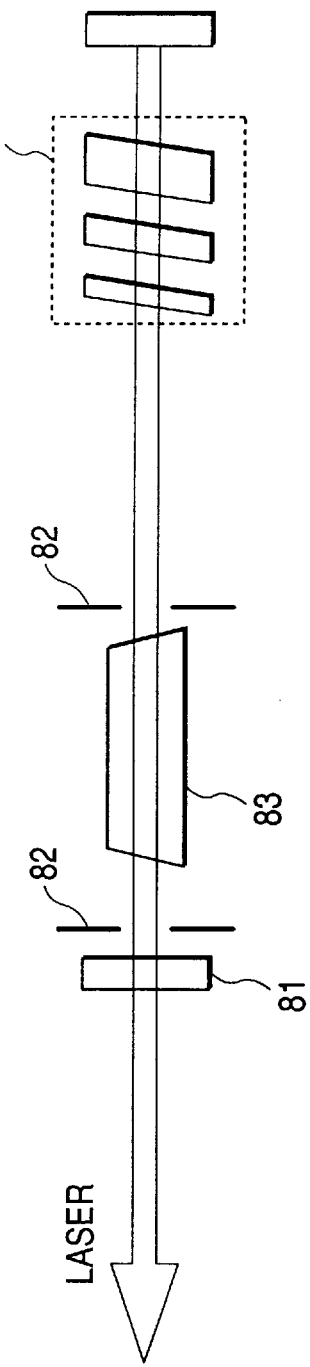

FLUORIDE REFINING METHOD AND FLUORIDE CRYSTAL MANUFACTURING METHOD, AND OPTICAL PART AND ALIGNER USING SAME

BACKGROUND OF THE INVENTION

1. Field of the Invention

The present invention relates to a fluoride refining method and a fluoride crystal manufacturing method which are suitable for various optical elements, lenses, window materials, prisms or the like used for a light of a predetermined wavelength selected from a wide wavelength range between the vacuum ultraviolet region and the far infrared region. Further, the present invention relates to a technical field of optical parts and an aligner using the same.

2. Related Background Art

A fluoride crystal such as one of calcium fluoride has a high transmittance in a wide wavelength range between the vacuum ultraviolet region and the far infrared region, and is widely used for various optical elements, lenses, window materials, prisms or the like. Among them, fluorite (calcium fluoride) which is excellent in transmission characteristics at shorter wavelength is useful as an optical part for excimer laser. In particular, a calcium fluoride crystal of 70% or more in its internal transmittance to light of 135 nm in wavelength has a superior durability to an ArF excimer laser, and its transmission characteristics are less degraded by repeated irradiation with high-output laser.

For such a fluoride crystal, a process for melting and refining a raw material is required to increase bulk density of the raw material and remove impurities of the raw material. In this refining process, a scavenger which is a metal fluoride must be added to a raw material to remove an oxide produced by a reaction of the raw material with water or the like, or impurities in the raw material. For example, when the fluoride crystal is calcium fluoride, and when the scavenger is solid $ZnF_2$, CaO produced by a reaction of the raw material with water reacts with $ZnF_2$ to be converted to $CaF_2$, while the scavenger becomes ZnO to evaporate during melting of the raw material.

When a high-quality fluoride crystal with superior optical performance is to be obtained, the above mentioned refining process must be repeated several times. In addition, a raw material of a high purity with less impurities must be employed.

When a crystal is manufactured using the thus obtained fluoride crystal block as a raw material, a fluoride crystal with very superior optical performance such as transmission characteristics is obtained.

On the other hand, there is a method in which a gaseous scavenger is used instead of a solid scavenger. A reactive gas that can be used as a gaseous scavenger includes hydrogen fluoride gas or carbon fluoride gas.

However, since the solid scavenger contains a metal element, there is a case where the metal element remains in the crystal, which affects the transmission characteristics. Therefore, when the addition amount of the solid scavenger is decreased, or when a cover of a crucible is bored to increase degassing properties, the metal element from the scavenger hardly remains in the crystal. However, if the addition amount is too small, the effect of the scavenger decreases. In addition, if the degassing properties are increased excessively by boring the crucible cover excessively, the scavenger is discharged to the outside of the crucible before exhibiting its effect. Thus, improvement in the transmission characteristics is prevented by contamination of the fluoride with an oxide or the like. Therefore, it becomes important to define an optimum addition amount of a scavenger or to design a crucible in such a shape as to optimize the degassing properties. However, these vary depending on the content of water or impurities of a raw material, and lacks general-purpose use.

On the other hand, a hydrogen fluoride gas of the gaseous scavenger has corrosion properties, and sulfur tetrafluoride and boron trifluoride have toxicity. Thus, the management cost is increased. In addition, the gas is dissolved in the melt and is often incorporated as air bubbles into the crystal (Guggenheim, J. Appl. Phys. 34, pp. 2482–2485 (1963)), and satisfactory transmission characteristics are hardly obtained.

Further, when a carbon fluoride gas such as methane tetrafluoride ($CF_4$) is used as a reactive gas, a crystal with superior transmission characteristics can be obtained. However, these gases are very stable in the air. Further, these gases are greenhouse effect gasses causing global warming as with carbon dioxide and must be removed by decomposition with plasma or the like, thereby increasing the management cost.

SUMMARY OF THE INVENTION

An object of the present invention is to provide a fluoride refining method and a fluoride crystal manufacturing method that have great general-purpose properties and can reduce the manufacturing cost.

Another object of the present invention is to provide at a low cost a fluoride crystal, an optical part and an aligner the transmission characteristics of which are hardly degraded even when repeatedly irradiated with a high-output light of a short wavelength for a long term.

The method of refining a fluoride according to the present invention comprises the heating step of heating a solid scavenger-added fluoride raw material to melt the raw material and the cooling step of cooling the molten fluoride material to solidify the melt, wherein the environment of a chamber housing the fluoride raw material is changed to such an environment that a gas in the chamber is discharged to the outside of the chamber more easily than the environment before the change, during the heating step.

BRIEF DESCRIPTION OF THE DRAWINGS

FIGS. 9A and 9B are schematic views showing an optical system of an excimer laser oscillator in which a fluoride crystal according to the present invention is used;

DETAILED DESCRIPTION OF THE PREFERRED EMBODIMENTS

The inventors have searched for a measure for improving optical performance using an inexpensive, general raw material and a solid scavenger in order to reduce high cost as described previously and found out that the environment of a chamber (for example, crucible) for housing a fluoride raw material in a refining process was very important. That is, it has been found that during the heating step, when the environment of a chamber housing a fluoride raw material is changed to such an environment that a gas in the chamber is discharged outside of the chamber more easily than the environment before the change, the scavenger stays in the crucible in the raw material heating to promote the reaction well, and the scavenger not used for the reaction and reaction products were all discharged to the outside of the crucible after the melting, thereby making it possible to maximize the effect of the scavenger and obtain a fluoride with a very high purity. In addition, it has been found that when the thus obtained fluoride is used, a crystal with superior optical performance is obtained.

In the specification and claims, as a term having the same meaning as the term "environment", the term "atmosphere" may be used. Hereinafter, the term "atmosphere" will mainly be used.

The expression "changing the environment", i.e., "changing the atmosphere" means a change to such a state that the gas inside the crucible chamber is easily discharged to the outside of the chamber. More specifically, for example, a first meaning is that the pressure outside the crucible chamber is decreased to change the current state to a state in which the gas inside the chamber is easily discharged to the outside of the chamber; a second meaning is that an opening and closing means provided in the crucible is opened to bring the inside and outside of the chamber in communication with each other, thereby changing the current state to a state in which the gas inside the chamber is easily discharged to the outside of the chamber; and a third meaning is that an inert gas supplied to the outside of the chamber is exhausted to reduce the pressure, thereby changing the current state to a state in which the gas inside the changer is easily discharged to the outside of the chamber.

Furthermore, combining at least two meanings of the above three meanings is included in the meaning of changing environment according to the present invention.

Figure 1:
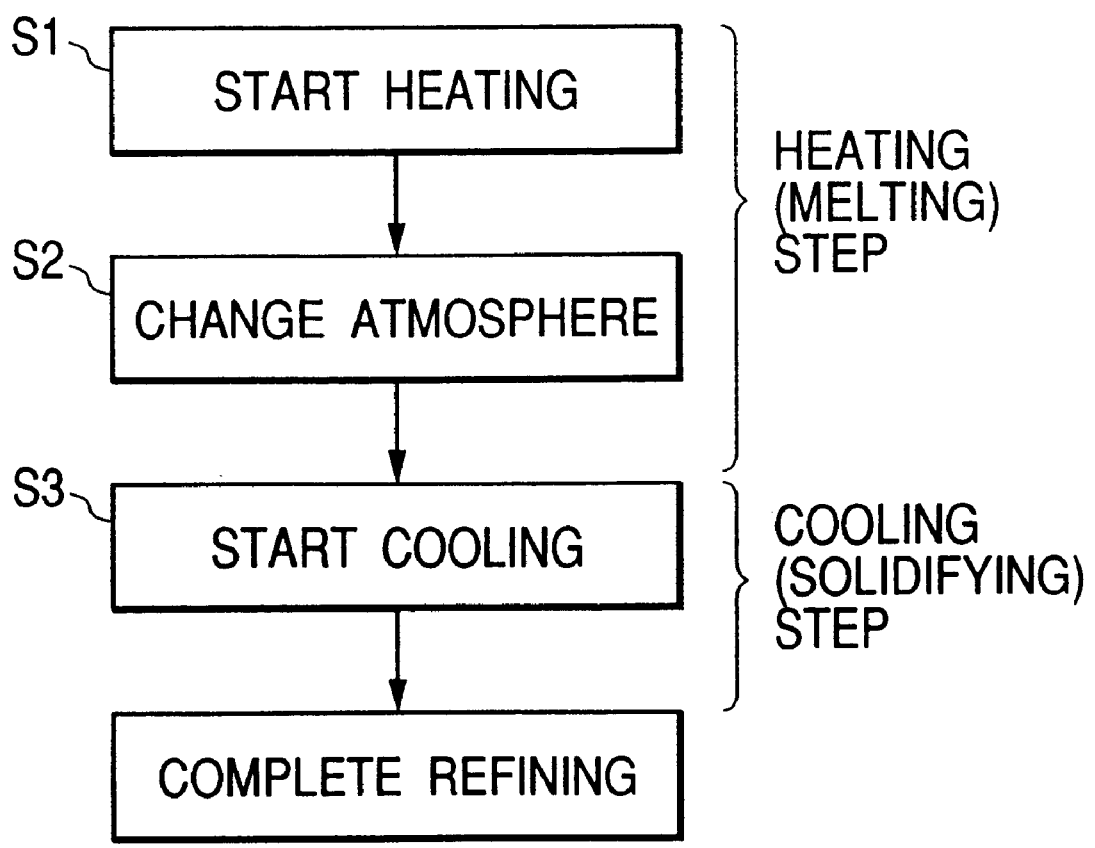
FIG. 1 is a flowchart of a fluoride refining process according to the present invention.

In FIG. 1, there is shown a flowchart of a method of refining a fluoride according to one of the preferred embodiments of the present invention.

In step S1, heating is started in order to melt a fluoride raw material such as calcium fluoride having a solid scavenger such as zinc fluoride or the like added thereto. Thereafter, as shown in step S2, the atmosphere of a chamber (for example, crucible) in which the fluoride is housed is changed to an atmosphere in which the gas inside the chamber is discharged to the outside of the chamber relatively easily.

After the change to the state in which the gas inside the chamber is easily discharged to the outside of the chamber, heating is continued so that a reaction product such as carbon dioxide or a vaporized scavenger is not incorporated into the raw material.

In step S3, cooling is started to solidify the molten raw material. In this step, as long as the temperature of the raw material is made lower than the melting point thereof, the external heating does not need to be completely stopped.

Figure 2:
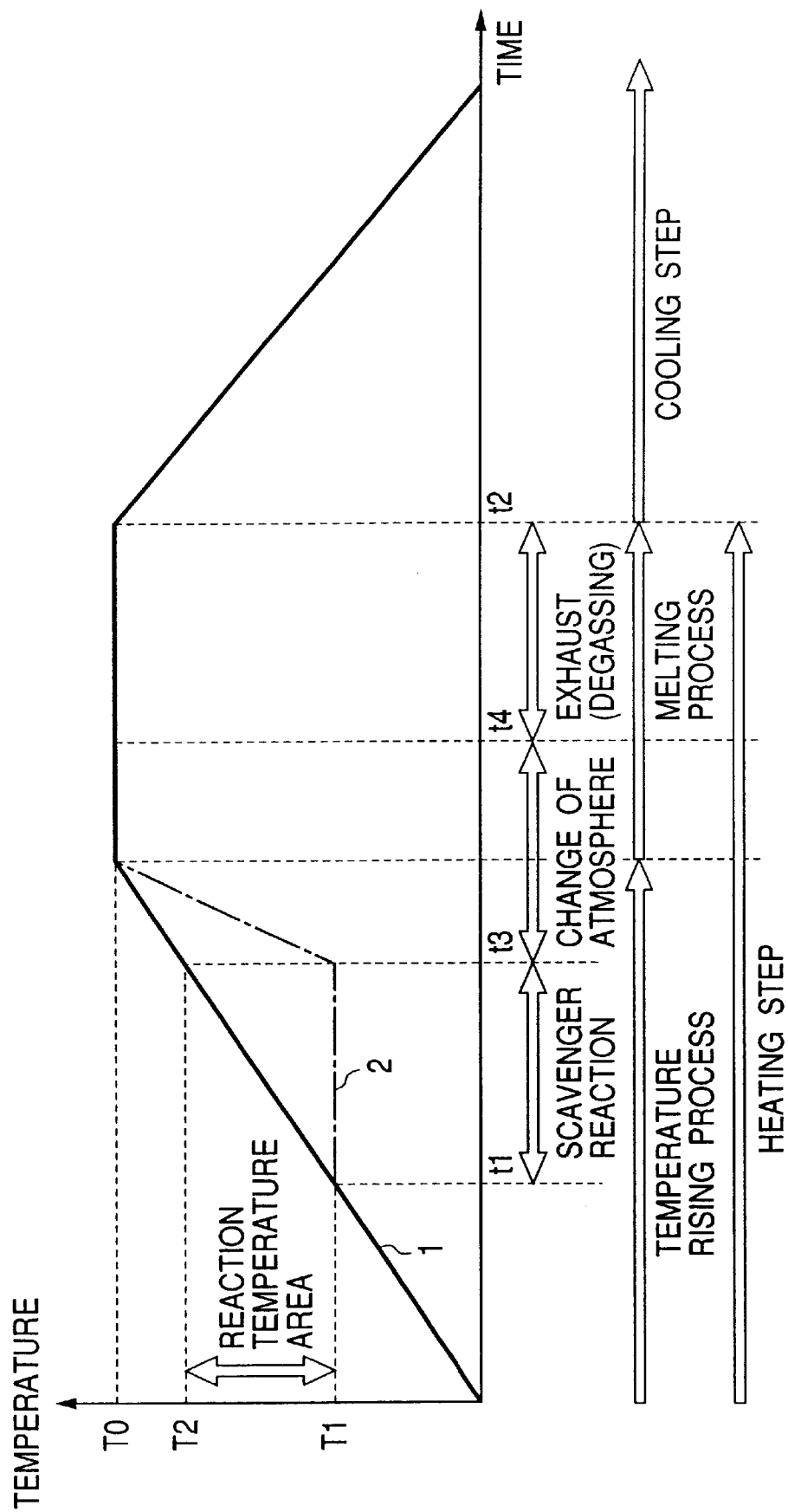
FIG. 2 is a graph for showing a temperature program in the refining process and for showing a permissible range of timing of switching the degassing properties of a crucible, i.e., the atmosphere.

The temperature to be reached in the heating step may be a melting point or more of the fluoride raw material fluoride to be refined. In a temperature raising process up to the melting point, the temperature may either be increased continuously as shown by reference numeral 1 in FIG. 2, or be increased intermittently as shown by reference numeral 2 in FIG. 2.

The atmosphere is changed at a timing after the temperature has reached a temperature T1 at which an impurity removing reaction (scavenge reaction) by the scavenger is started and before cooling is started. That is, the atmosphere is changed between times 't1' and 't2' in FIG. 2.

It is preferred that after a short time after the temperature has reached the scavenge reaction starting temperature T1, the change of atmosphere is started, and that the change is ended at a time sufficiently before cooling is started. That is, it is desirable that the change of atmosphere is started between times 't3' and 't4' in FIG. 2. Incidentally, 't3' is a time (t3) at which the impurity removing reaction by the scavenger is ended, and the fluoride raw material is at a temperature less than the melting point thereof.

The time 't4' is an arbitrary time before cooling is started after the fluoride raw material has been molten, and the fluoride raw material is at a temperature not less than the melting point thereof. The change of atmosphere is preferably made at a temperature not less than the melting point of the fluoride raw material in order to obtain fluoride with a higher purity. The gas inside the chamber is easily discharged to the outside of the gas chamber in the state of atmosphere between 't4' and 't2'.

For example, when zinc fluoride and calcium fluoride are employed as a solid scavenger and as a fluoride raw material, respectively, the scavenge reaction starting temperature is about 872° C. at which zinc fluoride is molten.

The time required for the scavenge reaction depends on the amount of the raw material to be refined. Therefore, upon actual work, for example, once the relationship between the required time and then amount of the raw material is obtained in advance through experiments, the required time can be determined based on the thus obtained time.

Changing the atmosphere means that, in a chamber such as a crucible in which a fluoride raw material is housed, a first atmosphere in which the gas inside the chamber is hardly discharged to the outside is changed to a second atmosphere in which the gas is easily discharged to the outside of the chamber.

In the first atmosphere, since the gas is hardly discharged to the outside, a solid scavenger is difficult to vaporize to escape therefrom. Therefore, the scavenge reaction proceeds efficiently.

In the second atmosphere, since a gas is easily discharged to the outside of the chamber, a reaction product or a remaining scavenger easily escapes to the outside of the chamber. Therefore, the reaction product and remaining scavenger is hardly incorporated into the refined raw material.

Specific examples of the change of atmosphere includes making the pressure of the second atmosphere less than that of the first atmosphere, changing a state in which the inside and outside of the chamber are isolated from each other (closed state) to a state in which the inside and outside of the chamber communicate with each other (open state).

The change of the former example can be achieved by increasing or decreasing the rate of exhausting the inside of the chamber or the rate of supplying an inert gas to the inside of the chamber.

The change of the latter example can be achieved by providing an aperture (i.e., opening portion) at a chamber such as a crucible and opening or closing the aperture, or opening or closing a valve of a gas supply pipe or gas exhaust pipe communicating with the chamber.

The pressure of the first atmosphere is not particularly limited but is preferably 1.3 Pa or more, and more preferably 1 atm (about 101.325 kPa) or more. In the present invention, 1 atm is 760 Torr. By setting the pressure to 1 atm or more, an effect that the impurities in the raw material and the scavenger react with each other effectively can be achieved.

The pressure of the second atmosphere is not particularly limited but is preferably 1 atm or less, and more preferably $10^{-3}$ Pa or less. By setting the pressure to $10^{-3}$ Pa or less, an effect that the reaction product and remaining scavenger are easily removed from the raw material can be achieved. In addition, it suffices to set the pressure of the second atmosphere to the extent such that a part of the raw material itself does not vaporize in a large amount.

As a gas for forming the first atmosphere, there is preferably employed an inert gas such as nitrogen, helium, argon, neon, krypton, or xenon.

As a gas for forming the second atmosphere, the above inert gas is also employed, but only exhaustion without supply of a gas may be carried out to establish vacuum.

After a short time after the second atmosphere has been formed, cooling is started to solidify the fluoride raw material.

The temperature reducing rate is not particularly limited but is preferably 300° C./h or less, and more preferably about 100° C./h.

In the case where a crystal is grown at the same time as refining, the temperature reducing rate is preferably 3–4° C./h.

The thus obtained fluoride has an oxygen content of 50 ppm or less and the content of a constituent metal element of the scavenger is 10 ppm or less.

Thus, in the present invention, a substance degrading the light transmission properties such as oxygen or a constituent metal element of the scavenger can be removed sufficiently in the refining step, so that in a crystal producing step subsequent to the refining step, i.e., in a crystal growth step requiring accurate control for crystal growth, an operation for removing the above substance can be simplified.

Further, the inside of the chamber is preferably dehydrated by purging with an inert gas or evacuation before the scavenge reaction as the occasion demands.

The fluoride raw material used in the present invention includes, for example, calcium fluoride, barium fluoride, magnesium fluoride or the like.

The solid scavenger used in the present invention includes, for example, lead fluoride, zinc fluoride, cadmium fluoride, manganese fluoride, bismuth fluoride, sodium fluoride, lithium fluoride or the like. The addition amount of the solid scavenger is preferably 0.1 mol % or more and 1 mol % or less of the fluoride raw material.

Figure 3:
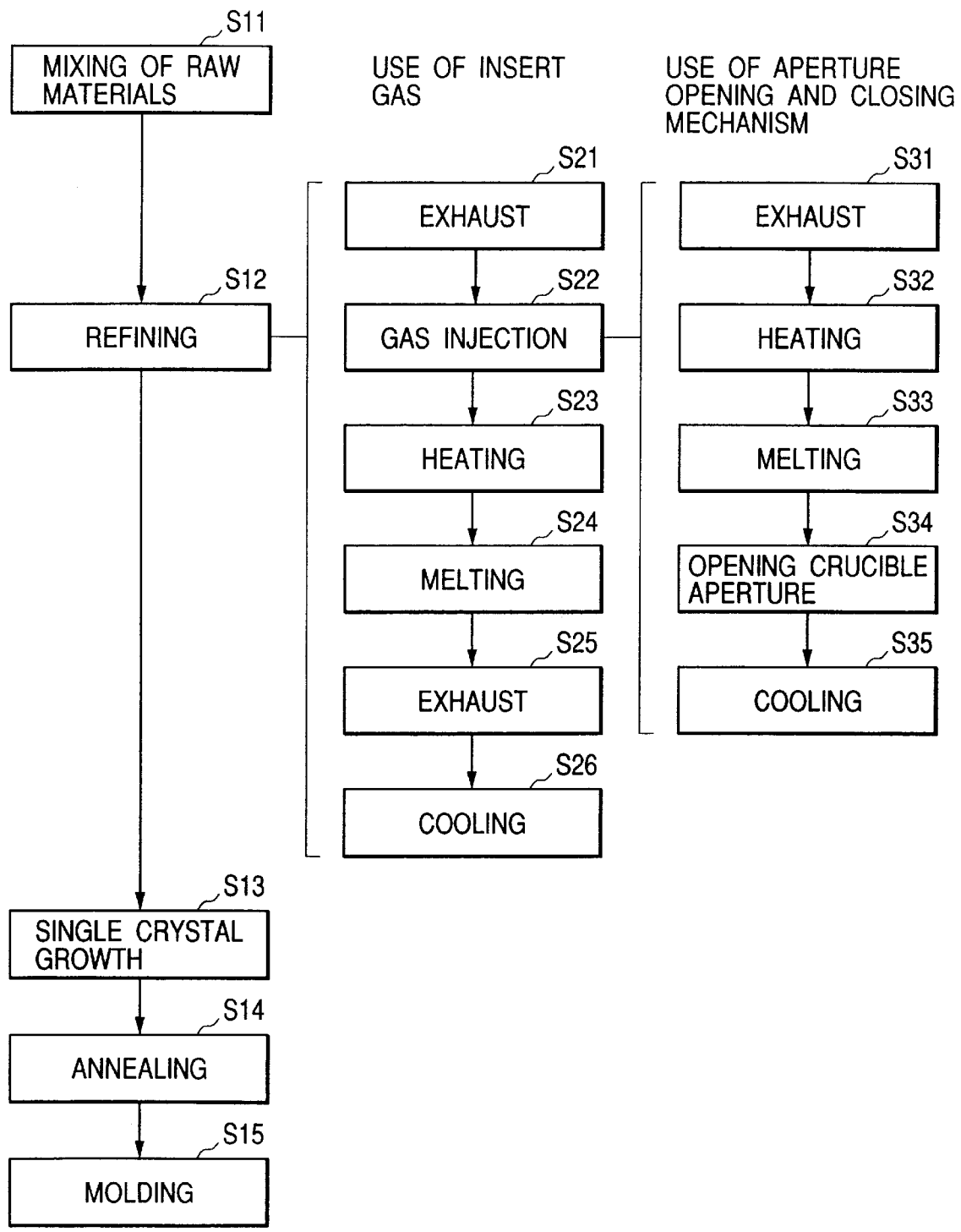
FIG. 3 is a flowchart for illustrating an example of a manufacturing process.

In FIG. 3, there is shown a flowchart of a method of refining a fluoride and a method of manufacturing a fluoride crystal according to another embodiment of the present invention.

(Raw Material Formulating Step S11)

A solid scavenger is added to a fluoride raw material and well mixed. The addition amount of the solid scavenger is 0.1 mol % or more and 1 mol % or less of the raw material. The fluoride raw material is preferably calcium fluoride, barium fluoride, or magnesium fluoride. Further, the fluoride used as the solid scavenger is preferably lead fluoride, zinc fluoride, cadmium fluoride, manganese fluoride, bismuth fluoride, sodium fluoride, or lithium fluoride.

(Refining Step S12)

Figure 4:
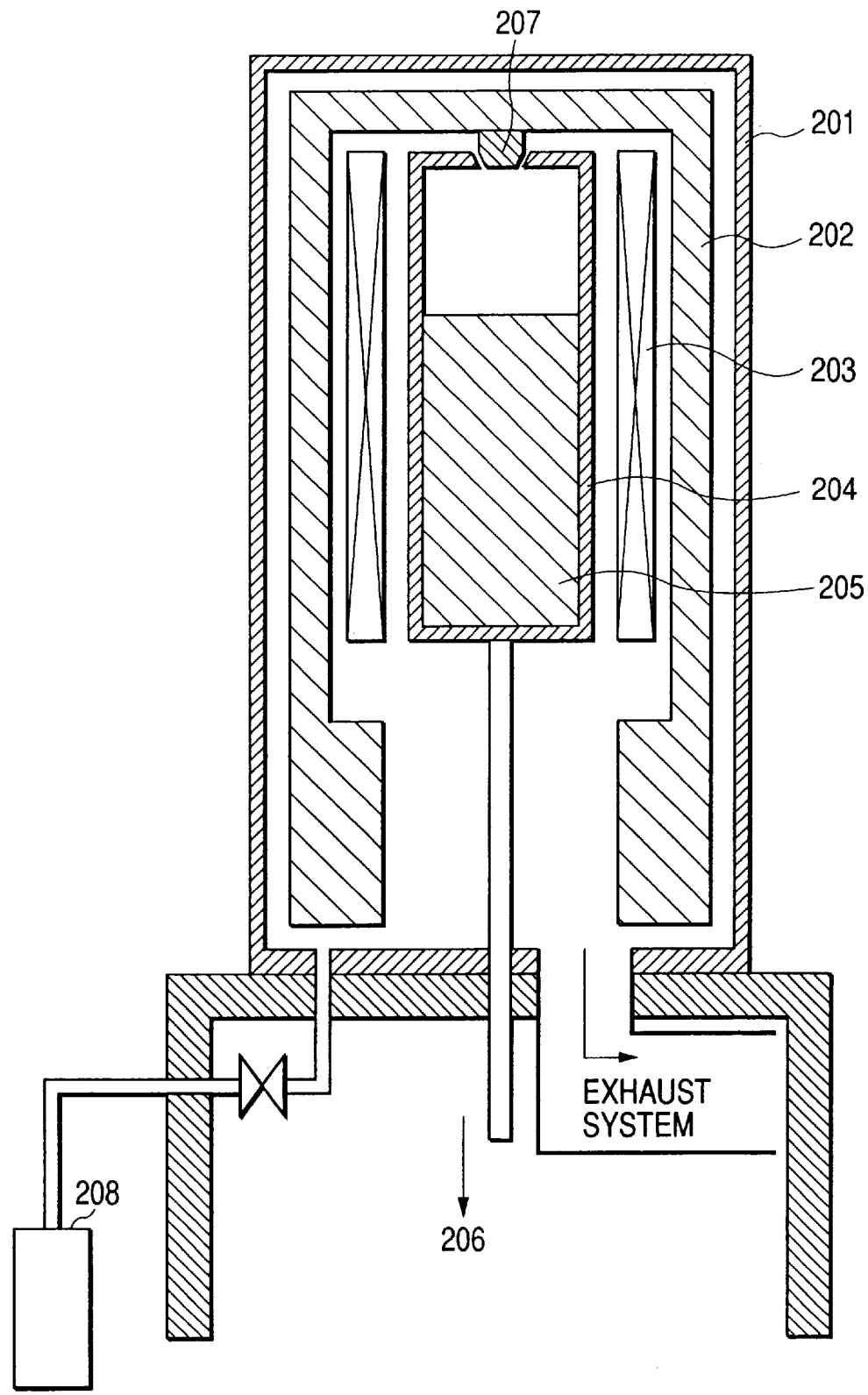
FIG. 4 is a schematic view showing a cross section of a refining furnace used in a refining process.

The fluoride raw material having the solid scavenger added and mixed therein is put in a crucible of a refining furnace shown in FIG. 4. In FIG. 4, reference numeral 201 denotes a chamber of the refining furnace, which is connected to a vacuum evacuation system. Reference numeral 202 denotes a heat insulating material, reference numeral 203 denotes a heater, reference numeral 204 denotes a crucible as a chamber for housing the raw material, and reference numeral 205 denotes the fluoride raw material. Reference numeral 206 is a mechanism for raising and lowering the crucible. A crucible aperture opening and closing mechanism 207 is fixed to the heat insulating material 202, for raising or lowering the crucible to close or open the aperture at the upper part of the crucible and also to control the size of the aperture. Reference numeral 208 denotes an inert gas introducing device.

(1) In the case where an inert gas is used:

After the inside of the furnace has been vacuum-evacuated with aperture being opened (S21), an inert gas is charged in the furnace at a pressure of about 1 atm or more (S22). The heater is energized to heat the crucible (S23), and the temperature is raised to a temperature at which an impurity removing reaction by the scavenger is carried out. When $PbF_2$ is used as the scavenger, the reaction is represented by the formula:

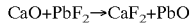

$$CaO+PbF_2 \rightarrow CaF_2+PbO$$

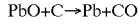

$$PbO+C \rightarrow Pb+CO$$

wherein C is a carbon material such as a crucible. Since the reaction includes formation of carbon monoxide, the reaction temperature can be easily estimated by carrying out gas analysis to detect carbon monoxide. To promote the reaction sufficiently, the rate of heating the raw material must be small in this temperature area. The inside of the furnace is evacuated to vacuum at a temperature at which the reaction has completed, and then, the raw material is completely molten (S24). Alternatively, after the raw material has been completely molten, the inside of the furnace is evacuated to vacuum (S25). After the degree of vacuum is well stabilized, the molten fluoride is slowly cooled (S26) to be solidified (melting/growth).

(2) In the case where a crucible aperture is opened and closed:

The inside of a crucible is evacuated to vacuum with the crucible aperture being closed (S31), and the crucible is heated by energizing the heater (S32). To promote an impurity removing reaction by the scavenger sufficiently, the rate of heating the raw material must be small in the temperature area in which the reaction proceeds. At a time when the temperature reaches a temperature at which the reaction has completed, the crucible aperture is opened, and the heating is further continued until the raw material is completely molten. Alternatively, after the raw material has been completely molten (S33), the crucible aperture is opened (S34). After the degree of vacuum has been well stabilized, the molten fluoride is slowly cooled (S35) to be solidified (melting/growth).

The fluoride obtained in this step may be a polycrystal or a single crystal with grain boundaries, so that accurate temperature control is not required. When annealing the fluoride, the crucible is preferably lowered. By the lowering, removal of impurities is improved more significantly.

Of the thus obtained crystal, in particular, the upper part, i.e., a lastly crystallized portion with the elapse of time is removed. Since impurities are liable to be concentrated in this portion, impurities which affect the characteristics are removed by this removal work.

(Single Crystal Growth Step S13)

A single crystal is grown using a refined crystal as a raw material. The growth method is suitably selected depending on the size or purpose of the grown crystal. As an example, a growth process using the Bridgeman method is shown below.

Figure 5:
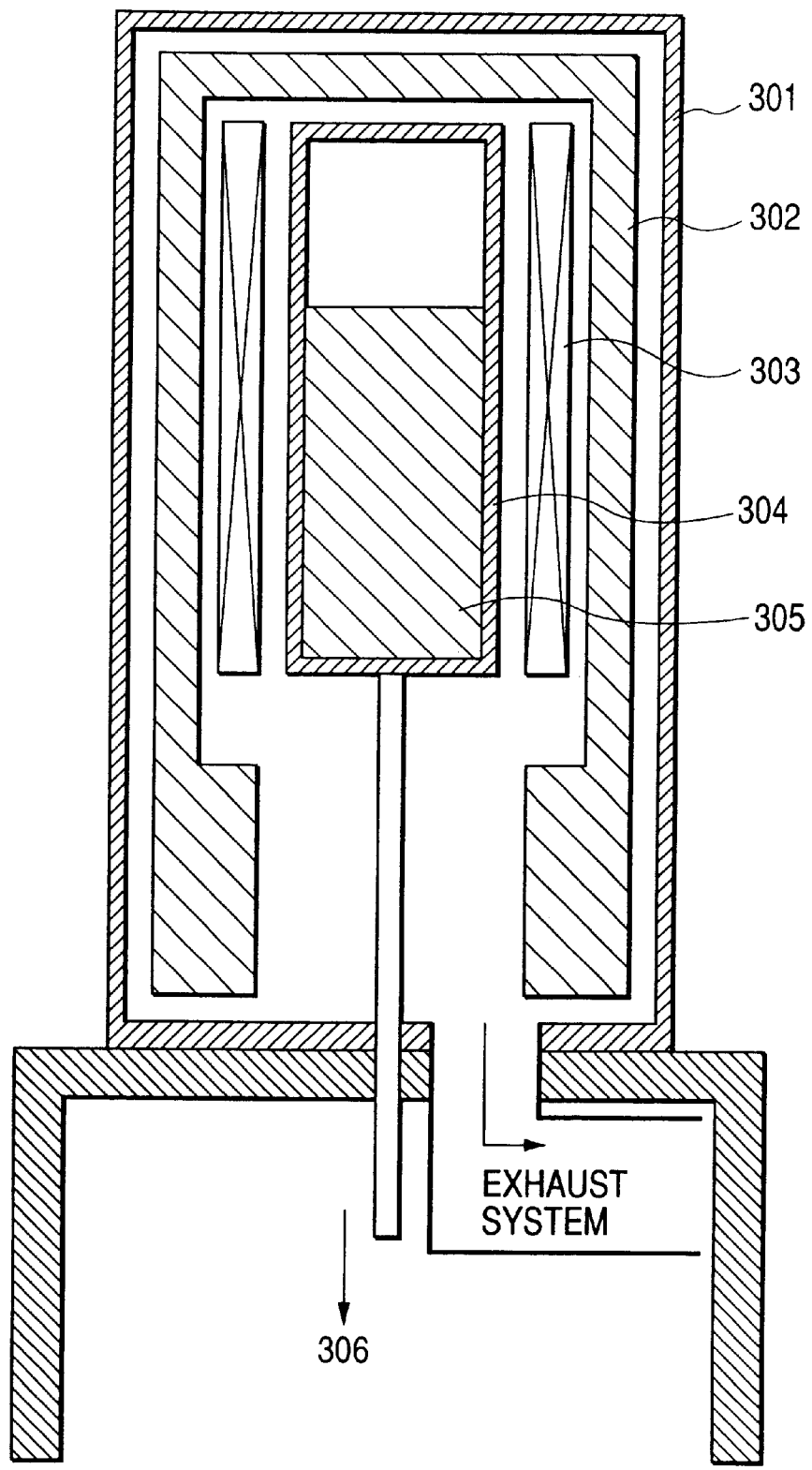
FIG. 5 is a schematic view showing a cross section of a growth furnace used in a single crystal growth process.

A refined crystal is put in a crucible of a growth furnace shown in FIG. 5. The crucible of the growth furnace is provided separately from the crucible of the refining furnace. In FIG. 5, reference numeral 301 denotes a chamber of the growth furnace, which is connected to a vacuum evacuating system. Reference numeral 302 denotes a heat insulating material, reference numeral 303 denotes a heater, reference numeral 304 denotes a crucible, reference numeral 305 denotes a fluoride crystal, and reference numeral 306 denotes a crucible lowering mechanism. The crucible of the growth furnace has high sealing properties to the external atmosphere. The fluoride raw material cooled and obtained by the refining furnace is taken out from the crucible of the refining furnace and is transferred to and housed in a crucible of a clean growth furnace. As a result, impurities removed from the fluoride raw material and adhering to the crucible wall of the refining furnace is prevented from being incorporated again into the fluoride raw material to be molten during crystal growth.

After the inside of the furnace is evacuated to vacuum, the crucible is heated by energizing the heater to completely melt a crystal as a raw material. Thereafter, the crucible is gradually lowered and cooled to grow a single crystal. The crucible lowering rate is preferably 0.1–5.0 mm per hour.

For the thus obtained fluoride crystal, the contents of oxygen and constituent elements of scavenger are very small. This is because the oxygen and constituent elements of scavenger can be well removed in the refining step. In the growth step also, the work of changing the atmosphere outside the crucible described with regard to the refining step may be carried out. In this case, a solid scavenger is put in the crucible, and further a work of removing impurities may be carried out. Alternatively, a work of removing impurities may be carried out without employing the solid scavenger.

(Annealing Step S14)

Figure 6:
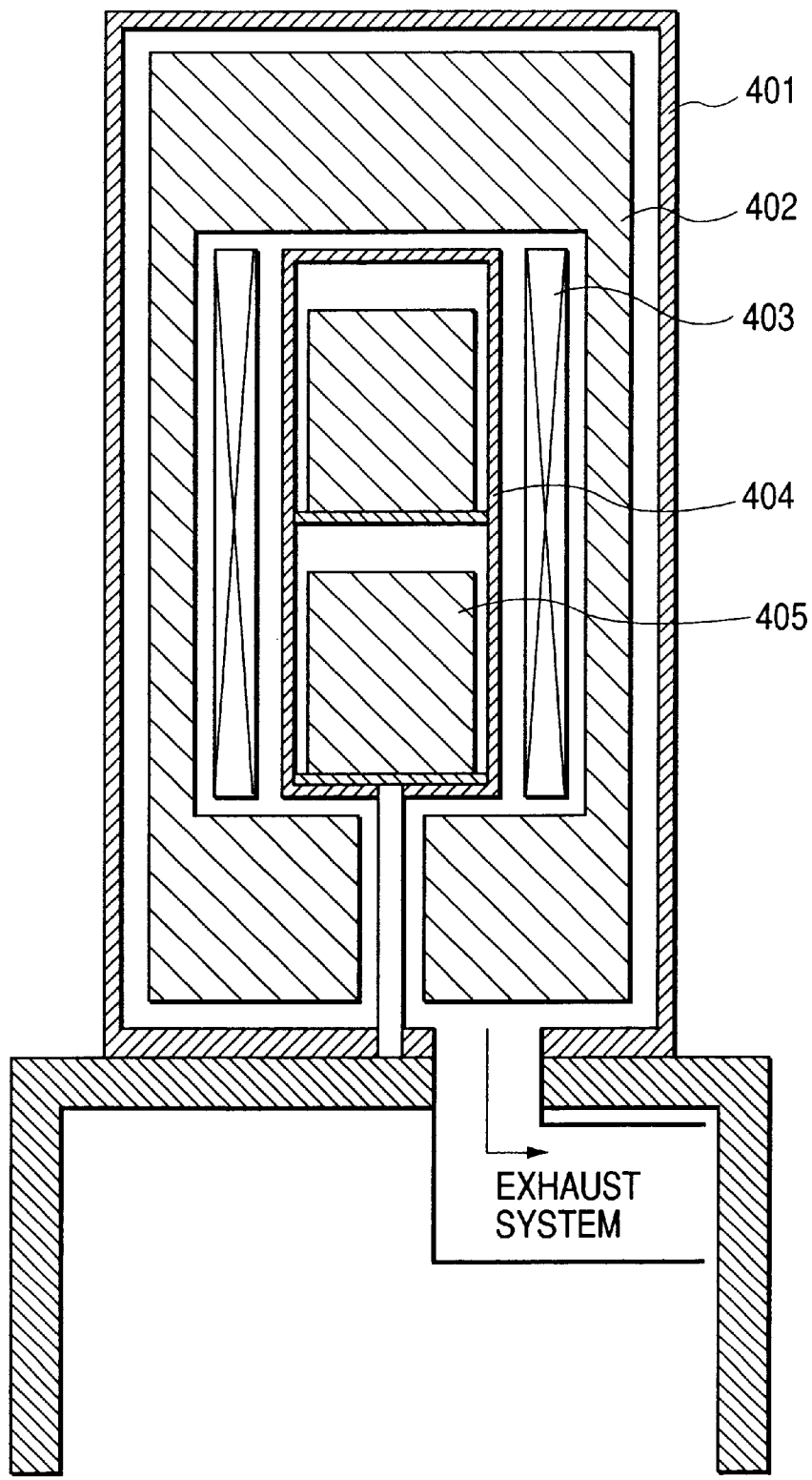
FIG. 6 is a schematic view showing a cross section of an annealing furnace used in an annealing process.

Subsequently, the thus grown fluoride single crystal is heat treated by an annealing furnace shown in FIG. 6. In FIG. 6, reference numeral 401 denotes a chamber of the annealing furnace, reference numeral 402 denotes a heat insulating material, reference numeral 403 denotes a heater, reference numeral 404 denotes a crucible, and reference numeral 405 denotes a fluoride crystal.

In this annealing process, the crucible is heated to a temperature of not more than 400–500° C. of the fluoride crystal melting point. The heating time is preferably 20 hours or more, and more preferably 20 to 30 hours.

In this regard, for a crystal having strength to thermal shock like magnesium fluoride crystal, the annealing step may be omitted.

(Molding Step S15)

Thereafter, the above crystal is molded (formed) in a shape of a required optical product (convex lens, concave lens, disc-shape, plate-shape or the like). Further, an antireflection film may be provided on a surface of the optical product of a fluoride crystal as the occasion demands. As the material of the antireflection film, magnesium fluoride, aluminum oxide, and tantalum oxide are preferably employed, and these can be formed in a film by evaporation by resistance heating, electron beam evaporation, spattering and the like. The optical product obtained according to the present invention hardly contains water, and thus, has superior adhesion of an antireflection film.

When thus obtained various kinds of lenses are combined, it is possible to configure an optical system having high durability suitable for a high energy laser beam such as excimer laser, especially ArF excimer laser, or $F_2$ excimer laser or the like. Particularly, in the case where the fluoride crystal is of calcium fluoride, it is possible to configure an aligner by combining an optical system comprised of an excimer laser light source and a lens formed of calcium fluoride crystal with a stage capable of moving a substrate as an exposed object.

(Aligner)

Hereinafter, an aligner using an optical product according to the present invention will be described.

The aligner includes an image reducing projection aligner using a lens optical system and a lens 1:1 magnification projection aligner.

In particular, in order to expose the entire surface of a wafer, it is desirable to use a stepper employing the step and repeat drawing method in which after one small section (field) of the wafer is exposed, the wafer is moved in one step, and adjacent one field is exposed. Of course, the optical product can be preferably used in a micro-scan type aligner.

Figure 7:
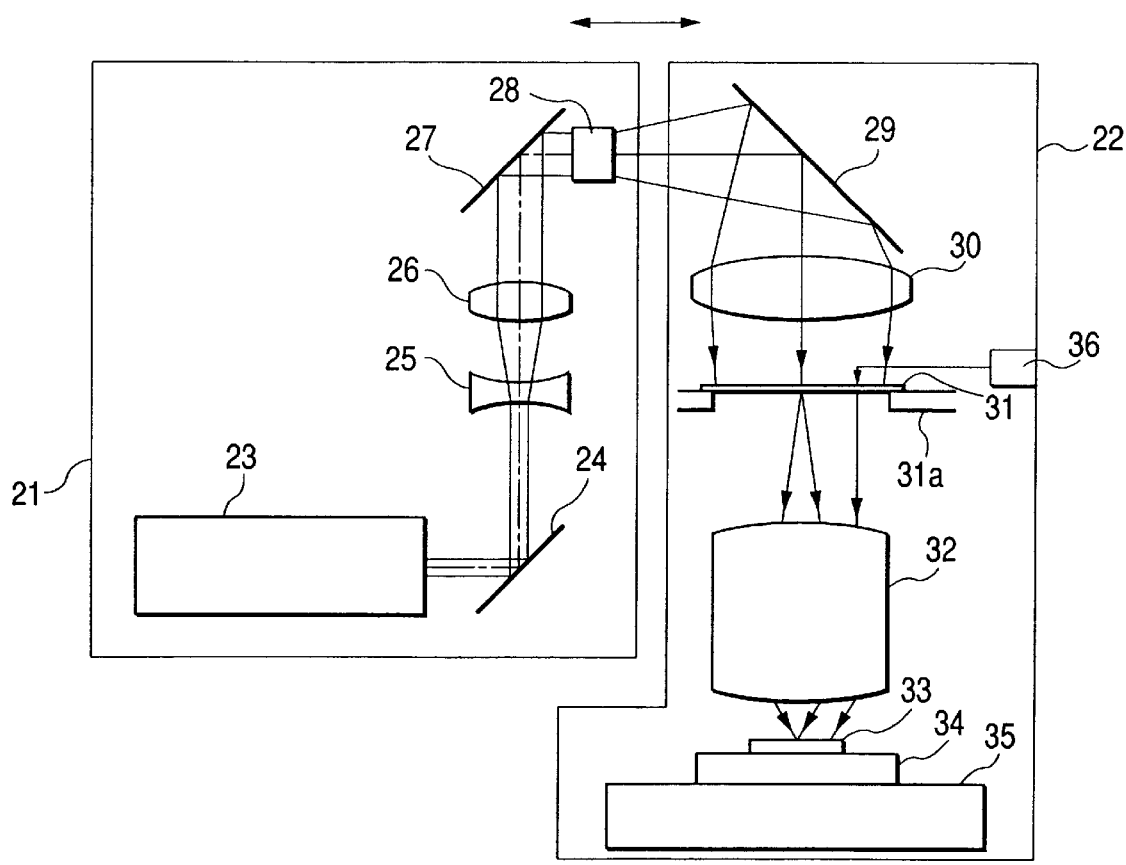
FIG. 7 is a schematic structural view of an aligner in which a fluoride crystal according to the present invention is used as an optical part.

In FIG. 7, there is shown a schematic structural view of an aligner according to the present invention. In the figure, reference numeral 21 denotes an illumination light source portion, and reference numeral 22 denotes an exposure mechanism portion. Thus, 21 and 22 are constructed independently of each other, that is, these two elements are physically separated. Reference numeral 23 denotes an illumination light source, for example, a high-output large-sized light source such as excimer lasers. Reference numeral 24 denotes a mirror; reference numeral 25 denotes a concave lens; and reference numeral 26 denotes a convex lens. These 25 and 26 serve as a beam expander for expanding the laser beam diameter to approximately the size of an optical integrator. Reference numeral 27 denotes a mirror, and reference numeral 28 denotes an optical integrator for uniformly illuminating the reticle. The illumination light source portion 21 is comprised of the laser 23 to the optical integrator 28. Reference numeral 29 denotes a mirror, and reference numeral 30 denotes a condenser lens for collimating the light flux emitted from the optical integrator 28. Reference numeral 31 denotes a reticle in which a circuit pattern is drawn; reference numeral 31a denotes a reticle holder for attracting and holding the reticle; reference numeral 32 denotes a projection optical system for projecting the reticle pattern; reference numeral 33 denotes a wafer having a pattern of the reticle 31 formed thereon by the projection lens 32. Reference numeral 34 denotes an XY stage that attracts and holds the wafer 33, and moves in XY directions when baking is carried out in the step and repeat system. Reference numeral 35 denotes a lapping plate of the aligner.

The exposure mechanism portion 22 is comprised of the mirror 29 to the lapping plate 35 that are a part of the illumination optical system. Reference numeral 36 denotes alignment means used for TTL alignment. In general, the aligner is further provided with an automatic focusing mechanism, a wafer carrying mechanism or the like, and these elements are also parts of the exposure mechanism portion 22.

Figure 8:
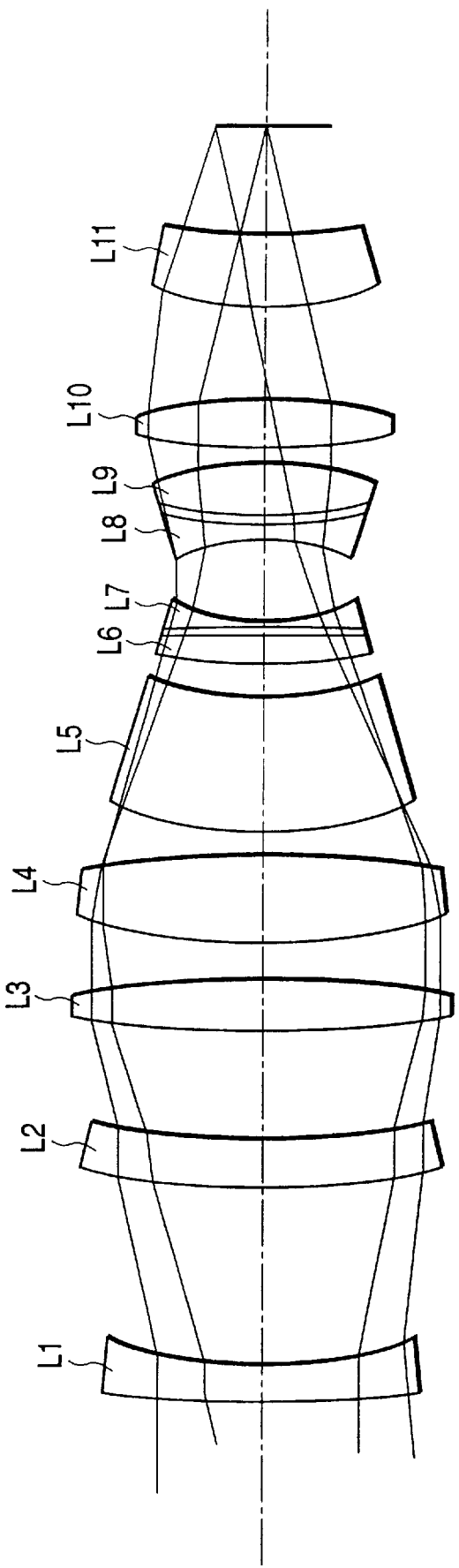
FIG. 8 is a schematic view showing a projection optical system of an aligner in which a fluoride crystal according to the present invention is used as an optical part.

In FIG. 8, there is shown an example of the optical product used for the aligner according to the present invention, i.e., a lens used in the projection optical system of the aligner shown in FIG. 7. This lens assembly is constructed by combining eleven lenses L1 to L11 without bonding them with each other. The optical product comprised of fluorite according to the present invention is used as a lens or mirror shown in FIG. 7 and FIG. 8 or is employed as a mirror or lens of a mirror projection aligner (not shown). More preferably, an antireflection film or a reflection enhancing film may be provided on the surface of the lens or mirror.

In addition, the optical part comprising a fluoride crystal according to the present invention can be used as a prism or etalon.

FIGS. 9A and 9B are schematic views showing the structure of an excimer laser oscillator using optical parts comprising a fluoride crystal according to the present invention.

The excimer laser oscillator shown in FIG. 9A comprises a resonator 83 for emitting an excimer laser and effecting resonance; a diaphragm hole 82 for diaphragming the excimer laser emitted from the resonator 83; a prism 84 for making single the wavelength of the excimer laser; and a reflection mirror 81 for reflecting the excimer laser.

In addition, the excimer laser oscillator shown in FIG. 9B comprises a resonator 83 for emitting an excimer laser and effecting resonance; a diaphragm hole 82 for diaphragming the excimer laser emitted from the resonator 83; an etalon 85 for making single the wavelength of the excimer laser; and a reflection mirror 81 for reflecting the excimer laser.

The excimer laser light oscillator in which an optical product comprised of a fluoride crystal according to the present invention is provided as a prism or etalon is capable of narrowing the wavelength of the excimer laser via the prism or etalon more significantly, and in other words, making the wavelength of the excimer laser single.

When a photosensitized resist on a substrate is irradiated with excimer laser light via a reticle pattern using this aligner, a latent image corresponding to a pattern to be formed can be formed.

The crucible used for refining in the present invention may be of such a configuration having a single space for housing the above mentioned fluoride raw material, i.e., a single chamber, and may alternatively be of another configuration having at least two chambers.

Figure 10A:
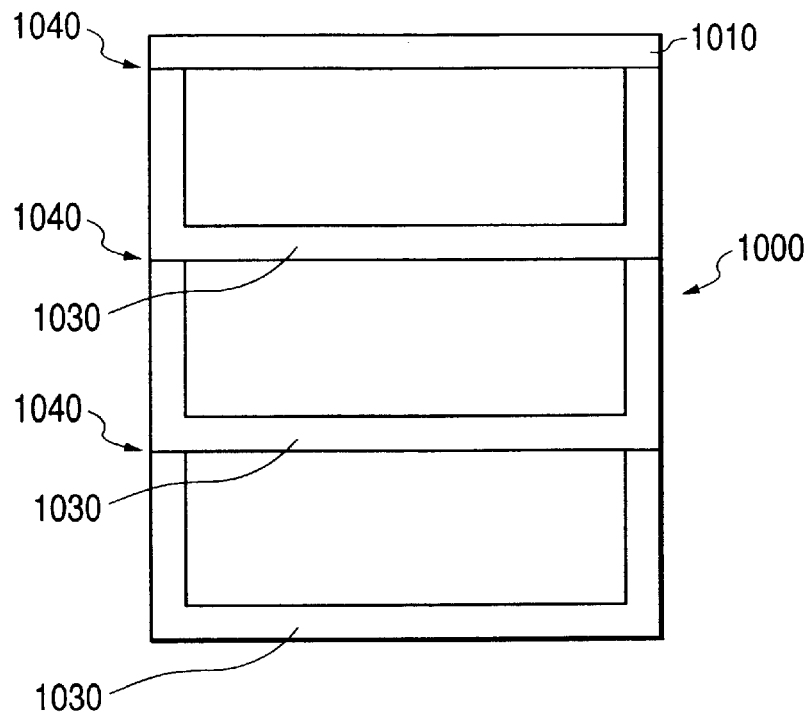
FIGS. 10A and 10B are schematic views showing cross sections of another refining furnace used in a refining process, FIG. 10A showing a multi-stage type crucible and FIG. 10B showing a multi-stage type crucible having holes on the side wall thereof.
Figure 10B:
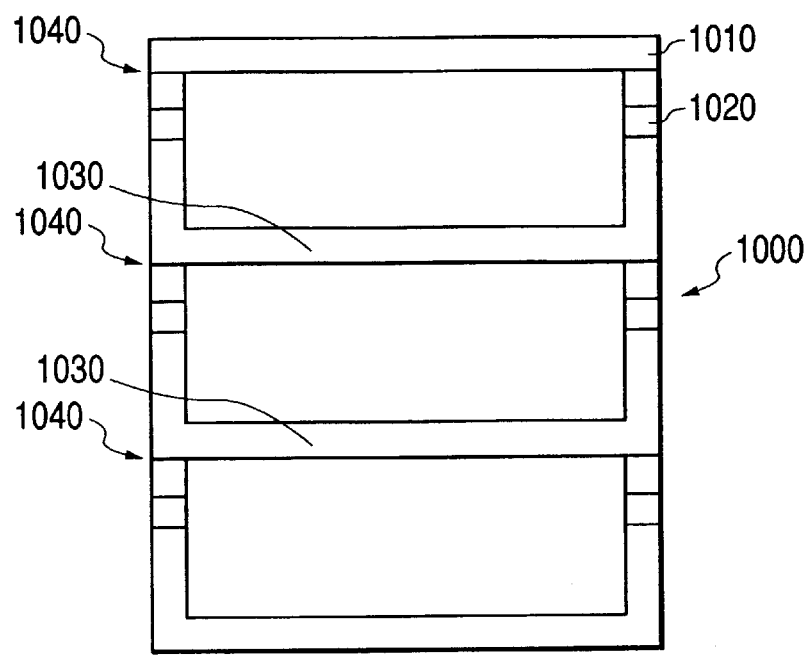

The crucible having such two or more chambers is shown in FIGS. 10A and 10B.

In FIGS. 10A and 10B, a plurality of crucibles 1000 are superposed upon each other, and the spaces of the crucibles are isolated independently by partition plate portions 1030 corresponding to the bottom surfaces of the crucibles 1000. In addition, a cover 1010 is provided so as to close an aperture of the top crucible 1000.

The fluoride raw material refined by these multi-stage type crucibles is formed in a disc-shape in accordance with the shape of each chamber. This disc-shaped fluoride raw material is easily carried, and is of a small size and can be easily molded.

In addition, these multi-stage type crucibles provides an advantage that heat is easily transmitted from the outside of the crucible to the center of each space through the partition plate portion 1030. Thus, the fluoride raw material can be refined while carrying out heat control effectively.

In FIG. 10A, each crucible 1000 is constructed such that gaseous impurities can be discharged from the crucible chamber to the pressure-reduced outside of the crucible via a slight clearance 1040 formed between the crucible and another crucible 1000 superposed thereon or the cover 1010.

In addition, in FIG. 10B, each crucible has two holes 1020 on its side wall portion symmetrically with regard to the center of the crucible, and is constructed such that gaseous impurities can be discharged from the crucible chamber to the pressure-reduced outside of the crucible via the two holes 1020 more easily than the crucible shown in FIG. 10A.

These holes may be provided with opening and closing means to suitably control opening and closing of the hole.

The crucible 1000 and the partition plate portion 1030 may be detachable from each other. In this case, the crucible 1000 may be cylindrical.

The hole 1020 provided at the side wall portion of the crucible 1000 may be formed in a circle or any other shapes, and the position of the hole may be the top or another suitable portion of the side wall. The number of holes may be determined as required without being limited to two as shown in the drawings. In the case where the number of holes is plural, the respective holes may be positioned each other symmetrically with regard to the center of the crucible or may be positioned unsymmetrically.

EXAMPLES

Hereinafter, the present invention will be described in more detail with reference to Examples.

Example 1

To an ordinary synthetic calcium fluoride raw material of 99% in purity was added and mixed zinc fluoride as a scavenger in an amount of about 0.5 mol % on the calcium fluoride basis. Next, this mixture was put in the crucible of the refining furnace shown in FIG. 4, and the inside of the furnace and crucible was evacuated and then filled with Ar until a pressure of $10^5$ Pa was reached. At this time, the aperture of the crucible was opened to increase degassing properties. Next, the aperture of the crucible was closed, and the crucible was heated to 1360° C. to melt the raw material. Then, the aperture was opened again to evacuate the inside of the furnace to set the degree of vacuum at $6.66 \times 10^{-4}$ Pa. Thereafter, the crucible was lowered and gradually cooled to crystalize the raw material. The top part of the crystallized calcium fluoride at the top part of the crucible was removed by 1 mm in thickness.

Next, the above crystal block was put in the crucible of the single crystal growth furnace shown in FIG. 5. The inside of the furnace was evacuated to vacuum, and the degree of vacuum of $2.66 \times 10^{-4}$ Pa and the temperature of 1360° C. were maintained for 11 hours, and then, the growth crucible was lowered at a rate of 2 mm/h. The diameter of the obtained fluoride single crystal can be suitably changed according to the inner diameter of the crucible of the single crystal growth furnace. For example, single crystals of 230 mm, 300 mm, and larger one in diameter were obtained.

Next, the grown single crystal of calcium fluoride and 0.1 wt % of zinc fluoride were put in a crucible of an annealing furnace. The inside of the furnace was evacuated, and the temperature of the crucible was increased from the room temperature to 900° C. at a rate of 100° C./h, and the crucible was then maintained at 900° C. for 20 hours. Thereafter, the temperature of the crucible was decreased at a rate of 6° C./h to cool the crucible to the room temperature.

Figure 11:
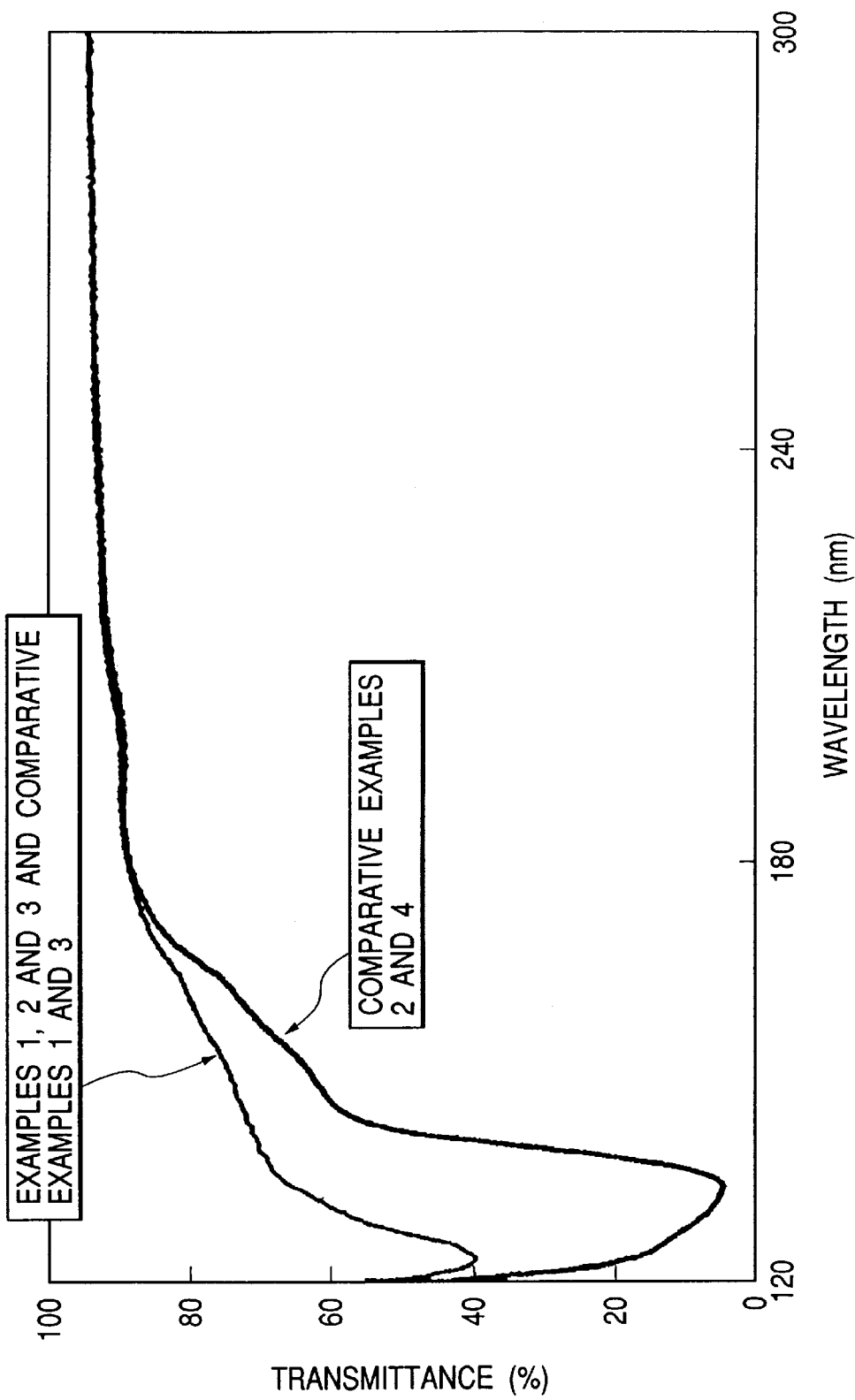
FIG. 11 is a graph showing transmission spectra of calcium fluoride crystals produced under various conditions.
Figure 12:
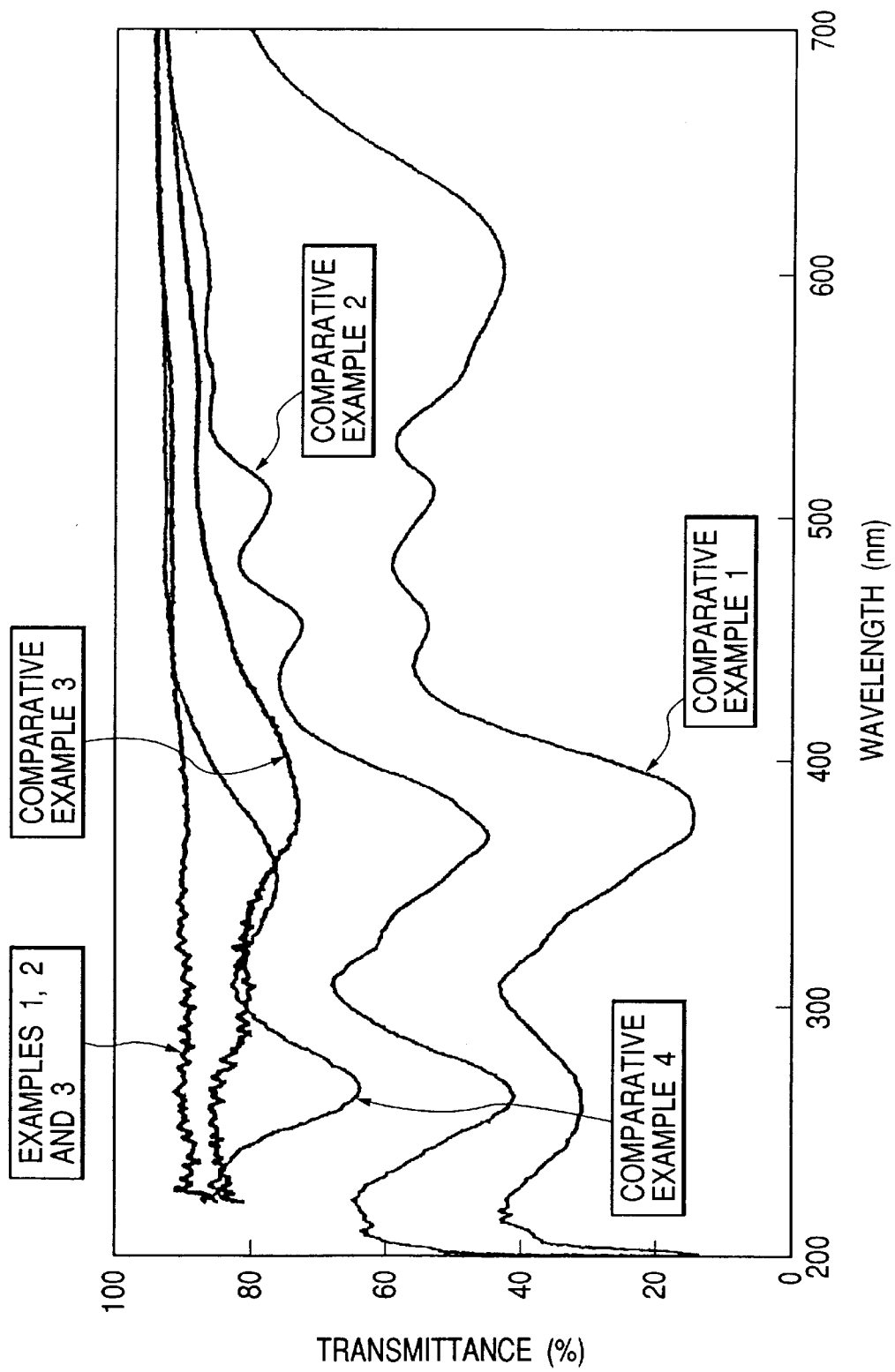
FIG. 12 is a graph showing transmission spectra after gamma-ray irradiation of calcium fluoride crystals produced under various conditions.

The thus obtained calcium fluoride crystal was cut and polished to form a disc of 10 mm in thickness, and the transmission spectrum in the vacuum ultraviolet region and the degradation rate of the internal transmittance due to gamma-ray irradiation were measured. FIG. 11 shows the transmission spectrum in the vacuum ultraviolet region, and FIG. 8 shows the transmission spectrum after gamma-ray irradiation. As a result, a calcium fluoride crystal having superior transmission characteristics in the vacuum ultraviolet region and significantly less degradation due to gamma-ray irradiation was obtained.

The internal transmittance was measured by means of a vacuum ultraviolet spectrophotometer. The term "internal transmittance" means a percentage when the amount of light incident in a medium, i.e., the fluoride is taken as a denominator, and the amount of light after passing through the medium by a unit distance is taken as a numerator. Primarily, the difference between the values in denominator and numerator is considered to be produced by absorption of the light by the material constituting the medium. Furthermore, the rate of degradation was obtained by irradiating the disc sample with gamma-ray of $1 \times 10^5$ R/H for one hour and measuring the transmittances before and after the irradiation by means of a visible region spectrophotometer.

Example 2

To an ordinary synthetic calcium fluoride raw material of 99% in purity was added and mixed zinc fluoride as a scavenger in an amount of about 0.5 mol % on the calcium fluoride basis. Next, this mixture was put in the crucible of the refining furnace shown in FIG. 4, and the inside of the furnace and crucible was evacuated. At this time, the aperture of the crucible was closed to lower the degassing properties. After the crucible was heated to 1360° C. to melt the raw material, the crucible was moved and the aperture of the crucible was opened to increase the degassing properties, and the degree of vacuum was set to $6.66 \times 10^{-4}$ Pa. Thereafter, the crucible was lowered and slowly cooled to crystalize the raw material. The top part of the crystallized calcium fluoride at the top part of the crucible was removed by 1 mm in thickness.

The subsequent steps were carried out in a manner similar to that in Example 1.

The thus obtained calcium fluoride crystal was cut and polished to form a disc of 10 mm in thickness, and the transmission spectrum in the vacuum ultraviolet region and the degradation rate of the internal transmittance due to gamma-ray irradiation were measured. FIG. 11 shows the transmission spectrum in the vacuum ultraviolet region, and FIG. 8 shows the transmission spectrum after gamma-ray irradiation. As a result, as with Example 1, a calcium fluoride crystal having superior transmission characteristics in the vacuum ultraviolet region and significantly less degradation due to gamma-ray irradiation was obtained.

Example 3

To an ordinary synthetic calcium fluoride raw material of 99% in purity was added and mixed zinc fluoride as a scavenger in an amount of about 0.5 mol % on the calcium fluoride basis. Next, this mixture was put in the crucible of the refining furnace shown in FIG. 4, and the inside of the furnace and crucible was evacuated. After the raw material was heated to a temperature at which a scavenge reaction takes place, the crucible was moved, and the aperture was opened to increase the degassing properties. Then, the raw material was heated to its melting point or above, and the degree of vacuum during melting was set to $6.66 \times 10^{-4}$ Pa. Thereafter, the crucible was lowered and gradually cooled to crystalize the raw material. The top part of the crystallized calcium fluoride at the top part of the crucible was removed by 1 mm in thickness.

The subsequent steps were carried out in a manner similar to that in Example 1.

The thus obtained calcium fluoride crystal was cut and polished to form a disc of 10 mm in thickness, and the transmission spectrum in the vacuum ultraviolet region and the degradation rate of the internal transmittance due to gamma-ray irradiation were measured. FIG. 11 shows the transmission spectrum in the vacuum ultraviolet region, and FIG. 8 shows the transmission spectrum after gamma-ray irradiation. As a result, as with Example 1, a calcium fluoride crystal having superior transmission characteristics in the vacuum ultraviolet region and significantly less degradation due to gamma-ray irradiation was obtained.

Comparative Example 1

To an ordinary synthetic calcium fluoride raw material of 99% in purity was added and mixed zinc fluoride as a scavenger in an amount of about 0.5 mol % on the calcium fluoride basis. Next, this mixture was put in the crucible of the refining furnace shown in FIG. 4, and the inside of the furnace was evacuated. At this time, the aperture of the crucible was opened to increase degassing properties. After the crucible was heated to 1360° C. to melt the raw material, the crucible was lowered and gradually cooled to crystalize the raw material. The top part of the crystallized calcium fluoride at the top part of the crucible was removed by 1 mm in thickness.

The subsequent steps were carried out in a manner similar to that in Example 1.

The thus obtained calcium fluoride crystal was cut and polished to form a disc of 10 mm in thickness, and the transmission spectrum in the vacuum ultraviolet region and the degradation rate of the internal transmittance due to gamma-ray irradiation were measured. FIG. 11 shows the transmission spectrum in the vacuum ultraviolet region, and FIG. 8 shows the transmission spectrum after gamma-ray irradiation. As a result, a calcium fluoride crystal having superior transmission characteristics in the vacuum ultraviolet region, but having significant degradation due to gamma-ray irradiation was obtained.

Comparative Example 2

To an ordinary synthetic calcium fluoride raw material of 99% in purity was added and mixed zinc fluoride as a scavenger in an amount of about 0.5 mol % on the calcium fluoride basis. Next, this mixture was put in the crucible of the refining furnace shown in FIG. 4, and the inside of the furnace was evacuated. At this time, the aperture of the crucible was closed to decrease degassing properties. After the crucible was heated to 1360° C. to melt the raw material, the crucible was lowered and gradually cooled to crystalize the raw material. The top part of the crystallized calcium fluoride at the top part of the crucible was removed by 1 mm in thickness.

The subsequent steps were carried out in a manner similar to that in Example 1.

The thus obtained calcium fluoride crystal was cut and polished to form a disc of 10 mm in thickness, and the transmission spectrum in the vacuum ultraviolet region and the degradation rate of the internal transmittance due to gamma-ray irradiation were measured. FIG. 11 shows the transmission spectrum in the vacuum ultraviolet region, and FIG. 8 shows the transmission spectrum after gamma-ray irradiation. As a result, a calcium fluoride crystal having reduced transmission characteristics in a wavelength region shorter than 170 nm and having significant degradation due to gamma-ray irradiation was obtained.

Comparative Example 3

A calcium fluoride crystal was obtained in a manner similar to that in Comparative Example 1 except that synthetic calcium fluoride raw material powder with high purity was used. The difference in concentration of impurities between the raw material with high purity and the ordinary synthetic raw material is shown in Table 1. The price of the raw material with high purity is 10 times as much as that of the ordinary synthetic raw material.

TABLE 1
Analytical Values of Impurities of Synthetic Calcium Fluoride Raw Material (Unit: ppm by Weight)

| Impurities | Ordinary synthetic raw material | Synthetic raw material with high purity |
|---|---|---|
| Mg | 5 | 2 |
| Al | 5 | 2 |
| Si | 30 | 8 |
| Fe | 2 | 1 |
| Sr | 270 | 24 |
| Y | 1 | <0.3 |
| Ba | 8 | 3 |
| La | <0.3 | <0.3 |
| Ce | <0.3 | <0.3 |
| Pb | <0.3 | <0.3 |

The thus obtained calcium fluoride crystal was cut and polished to form a disc of 10 mm in thickness, and the transmission spectrum in the vacuum ultraviolet region and the degradation rate of the internal transmittance due to gamma-ray irradiation were measured. FIG. 11 shows the transmission spectrum in the vacuum ultraviolet region, and FIG. 8 shows the transmission spectrum after gamma-ray irradiation. As a result, although synthetic calcium fluoride raw material with high purity was used, a calcium fluoride crystal was obtained which had superior transmission characteristics in the vacuum ultraviolet region but caused degradation due to gamma-ray irradiation.

Comparative Example 4

A calcium fluoride crystal was obtained in a manner similar to that in Comparative Example 2 except that synthetic calcium fluoride raw material powder with high purity was used.

The thus obtained calcium fluoride crystal was cut and polished to form a disc of 10 mm in thickness, and the transmission spectrum in the vacuum ultraviolet region and the degradation rate of the internal transmittance due to gamma-ray irradiation were measured. FIG. 11 shows the transmission spectrum in the vacuum ultraviolet region, and FIG. 8 shows the transmission spectrum after gamma-ray irradiation. As a result, although synthetic calcium fluoride raw material with high purity was used, a calcium fluoride crystal was obtained which had vacuum ultraviolet region transmission characteristics reduced in a wavelength region shorter than 170 nm and caused degradation due to gamma-ray irradiation.

According to the present invention, an inexpensive solid scavenger can be used to reduce the production cost.

In addition, since the refining capability is improved, a fluoride having desired characteristics can be obtained even when a raw material containing much impurities is employed, thus making it possible to reduce the production cost.

Further, since the number of refining works does not need to be increased, cost reduction can be achieved.

In addition, there can inexpensively be provided a fluoride crystal, an optical part and an aligner each having desired high durability and superior transmission characteristics.

What is claimed is:

1. A method of refining a fluoride comprising the steps of:
heating a scavenger-added fluoride raw material to melt the raw material; and
cooling the molten fluoride material to solidify the melt,
wherein the environment of a chamber housing the fluoride raw material is changed to such an environment that a gas in the chamber is discharged to the outside of the chamber more easily than the environment before the change, during the heating step, and
wherein the environment before the change is such that the pressure inside the chamber is 1.3 Pa or more and the environment after the change is such that the pressure inside the chamber is lower than the pressure before the change of the environment.

2. A method of refining a fluoride comprising the steps of:
heating a scavenger-added fluoride raw material to melt the raw material; and
cooling the molten fluoride material to solidify the melt,
wherein the heating step further comprises changing the environment of a chamber housing the fluoride raw material from a first state, in which the inside and outside of the chamber are isolated from each other, to a second state, in which the inside and outside of the chamber communicate with each other.

3. The method according to claim 1, wherein an inert gas is supplied into the chamber, and the pressure of an environment comprising the inert gas is reduced.

4. The method according to claim 1, wherein an inert gas is supplied into the chamber, and the inert gas in the chamber is exhausted during the heating step.

5. The method according to claim 1 or 2, wherein the pressure inside the chamber is changed from a first pressure of 1 atm or more to a second pressure less than the first pressure during the heating step.

6. The method according to claim 1 or 2, wherein the pressure inside the chamber is reduced to $10^{-3}$ Pa or less during the heating step.

7. The method according to claim 1 or 2, wherein the chamber is comprised of a crucible, and wherein an aperture provided in the crucible is opened or closed during the heating step.

8. The method according to claim 1 or 2, wherein the environment is changed at a temperature less than the melting point of the fluoride raw material.

9. The method according to claim 1 or 2, wherein the environment is changed at a temperature not less than the melting point of the fluoride raw material.

10. The method according to claim 1 or 2, wherein a crystal is grown in the cooling step to perform refining and growth at the same time.

11. A method of manufacturing a fluoride crystal comprising melting a fluoride refined by the refining method as set forth in claim 1 or 2 and effecting crystal growth to obtain a fluoride crystal.

12. An optical part obtained by a method of manufacturing a fluoride crystal comprising the steps of refining a fluoride by the refining method as set forth in claim 1 or 2.

13. An aligner comprising an optical system comprising:
(a) an optical part obtained by a method of manufacturing a fluoride crystal comprising the steps of refining a fluoride by the refining method of claim 1 or 2;
(b) an excimer laser light source; and
(c) a stage for placing an exposure object thereon.

14. The method according to claim 1 or 2, wherein the chamber is at least one of a plurality of spaces formed by dividing the inside of a crucible.

15. A method of refining a fluoride comprising the steps of:
heating a scavenger and a fluoride raw material in a chamber having an inner pressure of 1.3 Pa or more to promote a scavenger reaction; and thereafter
heating the fluoride raw material while reducing the pressure inside the chamber to promote a discharge of a gas from the chamber.

16. The method according to claim 15, wherein the pressure inside the chamber is reduced to $10^{-3}$ Pa or less.

17. The method according to claim 15, wherein the pressure inside the chamber is reduced so that the fluoride raw material melts.

18. The method according to any one of claims 15 to 17, wherein the fluoride is calcium fluoride.

19. A method of refining a fluoride comprising the steps of:
(a) evacuating a chamber housing a scavenger and a fluoride raw material;
(b) introducing an inert gas into the chamber;
(c) heating the scavenger and the fluoride raw material in the chamber containing the inert gas while maintaining the pressure inside the chamber at 1.3 Pa or more to promote a scavenger reaction; and
(d) heating the fluoride raw material while reducing the pressure inside the chamber to promote a discharge of a gas from the chamber.

20. The method according to claim 19, wherein the pressure inside the chamber in step (d) is reduced to $10^{-3}$ Pa or less.

21. The method according to claim 19, wherein the pressure inside the chamber is in step (d) reduced so that the fluoride raw material melts.

22. The method according to any one of claims 19 to 21, wherein the fluoride is calcium fluoride.

23. A method of manufacturing a fluoride comprising the steps of:
heating a scavenger and a fluoride raw material in a chamber of an inner pressure of 1.3 Pa or more to promote a scavenger reaction; and
heating the fluoride raw material while reducing pressure inside the chamber to promote a discharge of a gas from the chamber.

24. The method according to claim 23, wherein the pressure inside the chamber is reduced to $10^{-3}$ Pa or less.

25. The method according to claim 23, wherein the pressure inside the chamber is reduced so that the fluoride raw material melts.

26. The method according to claim 23, further comprising a last step of cooling to crystallize the fluoride.

27. The method according to any one of claims 23 to 26, wherein the fluoride is calcium fluoride.

28. A method of manufacturing a fluoride comprising:
(a) evacuating a chamber housing a scavenger and a fluoride raw material;
(b) introducing an inert gas into the chamber;
(c) heating the scavenger and the fluoride raw material in the chamber containing the inert gas while maintaining the pressure inside the chamber at 1.3 Pa more to promote a scavenger reaction; and
(d) heating the fluoride raw material while reducing the pressure inside the chamber to promote a discharge of a gas from the chamber.

29. The method according to claim 28, wherein the pressure inside the chamber in step (d) is reduced to $10^{-3}$ Pa or less.

30. The method according to claim 28, wherein the pressure inside the chamber in step (d) is reduced so that the fluoride raw material melts.

31. The method according to claim 28, further comprising a last step of cooling to crystallize the fluoride.

32. The method according to any one of claims 28 to 31, wherein the fluoride is calcium fluoride.

33. A method of refining a fluoride comprising the steps of:
providing a chamber having an opening that can be opened and closed and providing a scavenger and a fluoride raw material in the chamber;
heating the scavenger and the fluoride raw material in the chamber with the opening being closed to prevent unreacted scavenger from escaping from the chamber, thereby promoting a scavenger reaction; and
heating the fluoride raw material while opening the opening of the chamber to promote a discharge of a gas from the chamber, thereby preventing contamination of the fluoride.

34. The method according to claim 33, wherein the opening is opened to reduce the pressure inside the chamber to $10^{-3}$ Pa or less.

35. The method according to claim 33, wherein the opening of the chamber is opened so that the fluoride raw material melts.

36. The method according to any one of claims 33 to 35, wherein the fluoride is calcium fluoride.

37. A method of refining a fluoride comprising the steps of:
providing a chamber having an opening that can be opened and closed and providing a scavenger and a fluoride raw material in the chamber;
evacuating the chamber housing the scavenger and the fluoride raw material;
heating the scavenger and the fluoride raw material in the chamber with the opening being closed to prevent unreacted scavenger from escaping from the chamber, thereby promoting a scavenger reaction; and
heating the fluoride raw material while opening the opening of the chamber to promote a discharge of a gas from the chamber, thereby preventing contamination of the fluoride.

38. The method according to claim 37, wherein the opining is opened to reduce the pressure inside the chamber to $10^{-3}$ Pa or less.

39. The method according to claim 37, wherein the opening of the chamber is opened so that the fluoride raw material melts.

40. The method according to any one of claims 37 to 39, wherein the fluoride is calcium fluoride.

41. A method of manufacturing a fluoride comprising the steps of:
provide a chamber having an opening that can be opened and closed and providing a scavenger and a fluoride raw material in the chamber;
heating the scavenger and the fluoride raw material in the chamber with the opening being closed to prevent unreacted scavenger from escaping from the chamber, thereby promoting a scavenger reaction; and
heating the fluoride raw material while opening the opening of the chamber to promote a discharge of a gas from the chamber, thereby preventing contamination of the fluoride.

42. The method according to claim 41, wherein the opening is opened to reduce the pressure inside the chamber to $10^{-3}$ Pa or less.

43. The method according to 41, wherein the opening of the chamber is opened so that the fluoride raw material melts.

44. The method according to claim 41, further comprising a last step of cooling to crystallize the fluoride.

45. The method according to any one of claim 41 to 44, wherein the fluoride is calcium fluoride.

46. A method of manufacturing a fluoride comprising the steps of:
providing a chamber having an opening that can be opened and closed and providing a scavenger and a fluoride raw material in the chamber;
evacuating the chamber housing the scavenger and the fluoride raw material;
heating the scavenger and the fluoride raw material in the chamber with the opening being closed to prevent unreacted scavenger from escaping from the chamber, thereby promoting a scavenger reaction; and
heating the fluoride raw material while opening the opening of the chamber to promote a discharge of a gas from the chamber, thereby preventing contamination of the fluoride.

47. The method according to claim 46, wherein the opening is opened to reduce the pressure inside the chamber to $10^{-3}$ Pa or less.

48. The method according to claim 46, wherein the opening of the chamber is opened so that the fluoride raw material melts.

49. The method according to claims 46, further comprising a last step of cooling to crystallize the fluoride.

50. The method according to any one of claims 46 to 49, wherein the fluoride is calcium fluoride.

51. A method of manufacturing an optical part comprising the steps of:
manufacturing a fluoride by the manufacturing method as set forth in any one of claims 23, 28, 41 or 46; and
shaping the fluoride into the optical part.

52. A method of manufacturing an aligner comprising the steps of:
manufacturing an optical part according to the method of claim 51; and
combining the optical part, an excimer laser light source and a stage for placing an exposure object thereon.

53. An optical part obtained by the manufacturing method as set forth in claim 51.

54. An aligner obtained by the manufacturing method as set forth in claim 52.

55. The method according to any one of claims 1, 2, 15, 19, 23, 28, 33, 37, 41 and 46, wherein the scavenger is solid.

* * * * *

UNITED STATES PATENT AND TRADEMARK OFFICE
CERTIFICATE OF CORRECTION

PATENT NO.    : 6,488,769 B1
DATED         : December 3, 2002
INVENTOR(S)   : Tomoru Oba It is certified that error appears in the above-identified patent and that said Letters Patent is hereby corrected as shown below:

Column 15,
Line 50, "is in step (d)" should read -- in step (d) is --.

Column 16,
Line 63, "opining" should read -- opening --.

Column 17,
Line 24, "claim 41 to 44," should read -- claims 41 to 44 --.

Column 18,
Line 12, "claims 46," should read -- claim 46, --.

Signed and Sealed this

Fifteenth Day of November, 2005

JON W. DUDAS
*Director of the United States Patent and Trademark Office*